United States Patent
Ishikawa

Patent Number: 6,137,160
Date of Patent: Oct. 24, 2000

[54] LEAD FRAME FOR SEMICONDUCTOR DEVICES

[75] Inventor: Nobuhisa Ishikawa, Oita, Japan

[73] Assignee: Sony Corporation, Tokyo, Japan

[21] Appl. No.: 09/298,813

[22] Filed: Apr. 23, 1999

[30] Foreign Application Priority Data

Apr. 24, 1998 [JP] Japan ................................. 10-114495

[51] Int. Cl.⁷ ............................................... H01L 23/495
[52] U.S. Cl. ........................................... 257/676; 257/666
[58] Field of Search ..................................... 257/666, 676

[56] References Cited

U.S. PATENT DOCUMENTS

| | | |
|---|---|---|
| 4,797,726 | 1/1989 | Manabe . |
| 4,918,511 | 4/1990 | Brown . |
| 4,942,452 | 7/1990 | Kitano et al. . |
| 5,150,193 | 9/1992 | Yashuhara et al. . |
| 5,175,610 | 12/1992 | Kobayashi . |
| 5,233,222 | 8/1993 | Djennas et al. . |
| 5,847,446 | 12/1998 | Park et al. . |
| 5,874,773 | 2/1999 | Terada et al. . |

FOREIGN PATENT DOCUMENTS

| | | |
|---|---|---|
| 0 345 760 | 12/1989 | European Pat. Off. . |
| 0 503 769 | 9/1992 | European Pat. Off. . |
| 2 318 683 | 4/1998 | United Kingdom . |

*Primary Examiner*—Sheila V. Clark
*Attorney, Agent, or Firm*—Hill & Simpson

[57] ABSTRACT

To provide a lead frame for semiconductor devices which is structured so as to prevent extension of separation caused on the interface between a semiconductor element and a semiconductor element die pad or the interface between the semiconductor element die pad and sealing resin into the sealing resin while slits function as anchor, a lead frame comprises a planer semiconductor element die pad for supporting a semiconductor element and has slits extending through the semiconductor element die pad from the semiconductor element supporting side to the back side. The slit is formed so that the side wall surfaces are inclined gradually to the inside or outside increasingly from the semiconductor element supporting side to the back side on the central areas, and is formed so that the respective side wall surfaces are inclined gradually in the inverse relation to the side wall surface of the central areas from the semiconductor element supporting side to the back side on the areas of both ends.

16 Claims, 6 Drawing Sheets

LEAD FRAME FOR SEMICONDUCTOR DEVICES

BACKGROUND OF THE INVENTION

1. Field of the Invention

This invention relates to a lead frame for semiconductor devices comprising a semiconductor element die pad for supporting a semiconductor element.

2. Description of Related Art

Heretofore, various types of semiconductor devices with variation in material and shape have been known, for example, a lead frame 2 which is used for a resin sealed semiconductor device 1 as shown in FIG. 3 has been known.

The lead frame 2 has a semiconductor element die pad 3 made of metal material having a thickness of, for example, 0.1 to 0.2 mm, on which die pad 3 a semiconductor element 4 is placed and adhered with adhesive 5. On the semiconductor element die pad 3, the semiconductor element 4 is electrically connected to internal derivation leads 7 of the lead frame 2 though bonding wires 6, such structural components are sealed with sealing resin 8 such as epoxy resin. External derivation leads 9 of the lead frame 2 are lead out from the sealing resin 8, which has been outer-plated and molded, to the outside.

In such a lead frame 2, a semiconductor element die pad 3 is formed in, for example, planer square shape as shown in FIG. 4, slits 10, which extend through from the semiconductor element supporting side (front side) to the back side, are formed in the cross shape. The slits 10 are formed in order to improve the cracking-resistant property of the semiconductor element die pad 3.

To form a semiconductor device 1 by use of such a lead frame for semiconductor devices 2, first thermosetting resin adhesive 5 is coated on a semiconductor element die pad 3 as shown in FIG. 5A, and a semiconductor element 4 is placed on the semiconductor element die pad 3 as shown in FIG. 5B. These components are heated a t a temperature of about 150° C. for 1 to 2 hours to harden the adhesive 5.

Next, the semiconductor element 4 is electrically connected to internal derivation leads 7 with bonding wires 6 as shown in FIG. 5C. The respective components are placed in a prescribed mold (not shown in the drawing), molten sealing resin 8 consisting of a resin such as epoxy resin is filled in the mold, and the sealing resin 8 is hardened to seal the semiconductor element 4 as shown in FIG. 5D. Subsequently, the external derivation leads 9 are subjected to plating and forming to obtain a semiconductor device 1 as shown in FIG. 5E.

The above-mentioned semiconductor device 1 is usually subjected to cracking-resistance test (soldering heat resistance test) as one of quality assurance tests, in this testing, the semiconductor device 1 is conditioned under an ordinary temperature and humidity condition for a long time to cause some moisture absorption of the semiconductor device 1.

When the semiconductor device which absorbs moisture is processed through a mounting process, the semiconductor device 1 is heated from an ordinal temperature to a high temperature such as 230° C. When, moisture contained in the semiconductor device 1 expands to cause separation of interface between the semiconductor element die pad 3 and sealing resin 8, interface between the semiconductor element 4 and semiconductor element die pad 3, or interface between the semiconductor element 4 and sealing resin 8. The separation proceeds further to cause cracking of the sealing resin 8 in the internal of the semiconductor device 1, and the cracking extends to the outside surface to damage the function of the semiconductor device 1.

The mechanism of such cracking is described in detail. FIG. 6A is a diagram for describing a semiconductor device 1 at the time immediately after the semiconductor device 1 is to be conditioned under an ordinary temperature and humidity condition, as shown in FIG. 6A, the semiconductor device 1 is surrounded by moisture of the external environment of ordinal temperature and humidity. Herein, the semiconductor device 1 does not contain moisture because the semiconductor device 1 is moisture-proof packaged.

Afterward, the semiconductor device 1 is conditioned under an ordinal temperature and humidity condition to cause continuous absorption of moisture from the external environment as shown in FIG. 6B, and at last moisture penetrates to the interface between the semiconductor element die pad 3 and sealing resin 8 or the interface between the semiconductor element 4 and sealing resin 8.

When semiconductor device 1 which contains moisture is heated as shown in FIG. 6C, the moisture in the small space on the interface between the semiconductor element die pad 3 and sealing resin 8, the interface between the semiconductor element 4 and semiconductor element die pad 3, or the interface between the semiconductor element 4 and sealing resin 7 is evaporated to expand, and the expansion causes separation of the interface. The pressure on the separated interface due to evaporation expansion of moisture increases, and when the internal stress exceeds the bending strength of sealing resin 8, the sealing resin cracks as shown in FIG. 6D and the crack extends to the outside surface.

To solve such problem, heretofore slits 10 . . . are formed on the semiconductor element die pad 3 as described herein above to bond the back side of the semiconductor element 4 to the sealing resin 8 together strongly, and separation of the interface as shown in FIG. 5C is prevented. In detail, on the entire periphery of a slit 10 shown in FIG. 4, the side wall surface of the slit is formed so that the side wall surfaces are inclined gradually to the inside increasingly from the semiconductor element supporting side to the back side as shown in FIG. 7 and so that the inclination functions to anchor the sealing resin 8 in the slit 10 portion to strengthen the bonding of the interface between the back side of the semiconductor element 4 and the sealing resin 8.

However, though the side wall shape of the slit 10 shown in FIG. 7 functions as an anchor, on both ends of the side walls as shown in FIG. 8, the inclination functions undesirably to extend the separation caused on the interface between the semiconductor element 4 and the semiconductor element die pad 3 and the interface between the semiconductor element die pad 3 and sealing resin 8 into the sealing resin 8 on the back side of the semiconductor element die pad 3 resultantly, and further extend the separation from the internal of the sealing resin 8 to the outside surface of the sealing resin 8. Thus separation extends from the internal to the outside of the sealing resin 8 to cause cracking.

The present invention is accomplished to solve such problem, it is the object of the present invention to provide a lead frame for semiconductor devices which prevents extension of separation caused on the interface between a semiconductor element and a semiconductor element die pad or the interface between the semiconductor element die pad and sealing resin into the sealing resin while slits function as anchor.

SUMMARY OF THE INVENTION

A lead frame for semiconductor devices of the present invention comprises a planer semiconductor element die pad for supporting a semiconductor element and has slits extending through the semiconductor element die pad from the semiconductor element supporting side to the back side, wherein the slit is formed so that the side wall surfaces are inclined gradually to the inside or outside increasingly from the semiconductor element supporting side to the back side on the central portions and formed so that the respective side wall surfaces are inclined gradually in the inverse relation to the side wall surface of the central portions from the semiconductor element supporting side to the back side on the portions of both ends.

According to the lead frame for semiconductor devices of the present invention, because the side wall surface of the slit of a semiconductor element die pad is formed so as to be inclined gradually to the inside increasingly from the semiconductor element supporting side to the back side on the central portions, the inclination functions to anchor the sealing resin in the slit, and the bonding between the back side of the semiconductor element and sealing resin is strengthened.

On the other hand, because the side wall surface of the slit of the semiconductor element die pad is formed so as to be inclined gradually to the outside increasingly from the semiconductor element supporting side to the back side on the portion of both ends of the slit, the stress due to separation caused on the interface between the semiconductor element and the semiconductor element die pad or the interface between the semiconductor element die pad and sealing resin is guided along the side wall surfaces of both ends of the slit to the interface between the back side of the semiconductor element and sealing resin which are bonded together strongly, thus cracking of the sealing resin is prevented.

BRIEF DESCRIPTION OF THE DRAWINGS

Following drawings are for description of one embodiment of a lead frame for semiconductor frames of the present invention.

DETAILED DESCRIPTION OF THE PREFERRED EMBODIMENTS

Figure 4:
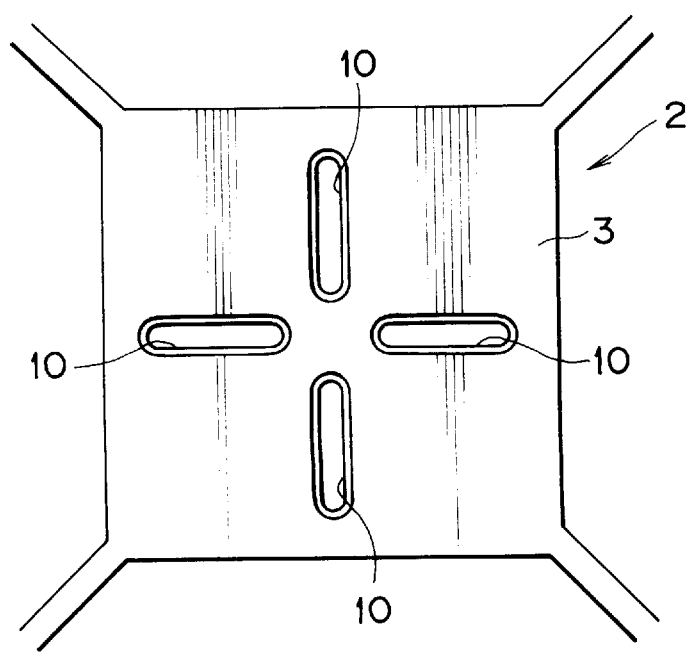
FIG. 4 is a plan view of a semiconductor element die pad of a conventional lead frame for semiconductor devices.
Figure 5A:
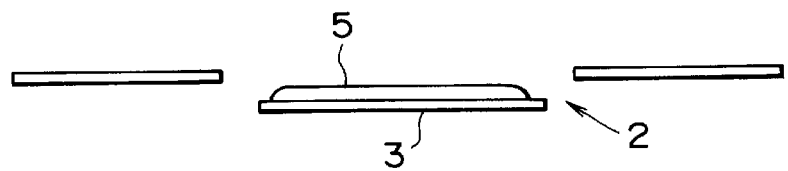
FIGS. 5A to 5E are cross sectional side views for describing the manufacturing process of the resin sealed semiconductor device shown in FIG. 3 in the order of succession.
Figure 5B:
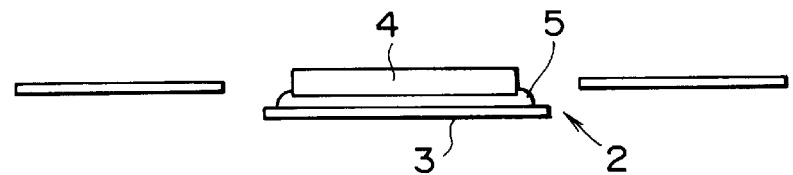
Figure 5C:
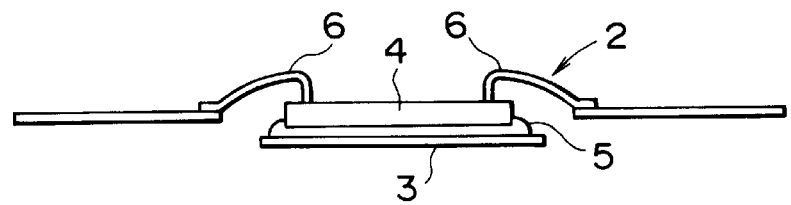
Figure 5D:
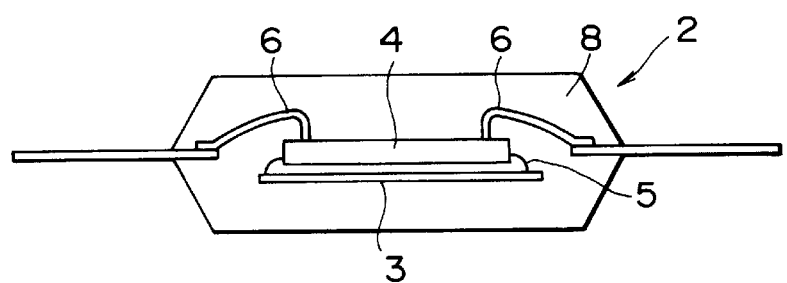
Figure 5E:
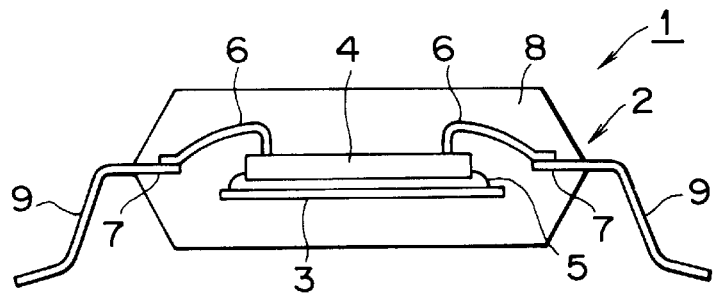
Figure 6A:
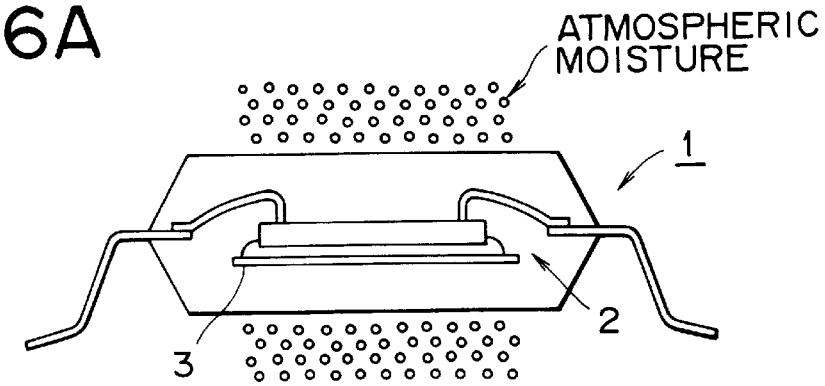
FIG. 6A to 6D are cross sectional side views for describing the mechanism of cracking in the resin sealed semiconductor device shown in FIG. 3.
Figure 6B:
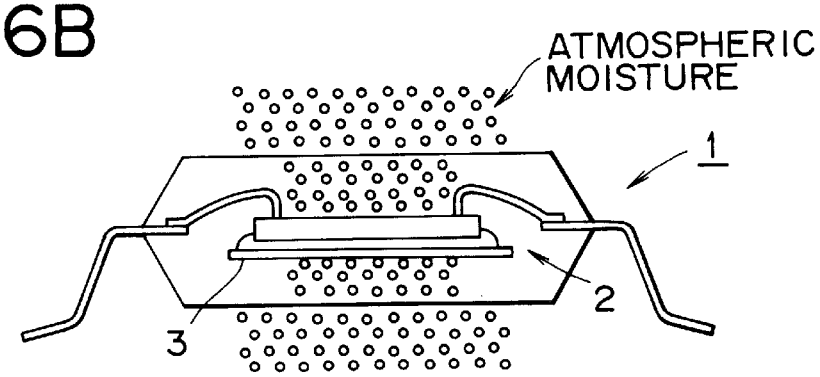
Figure 6C:
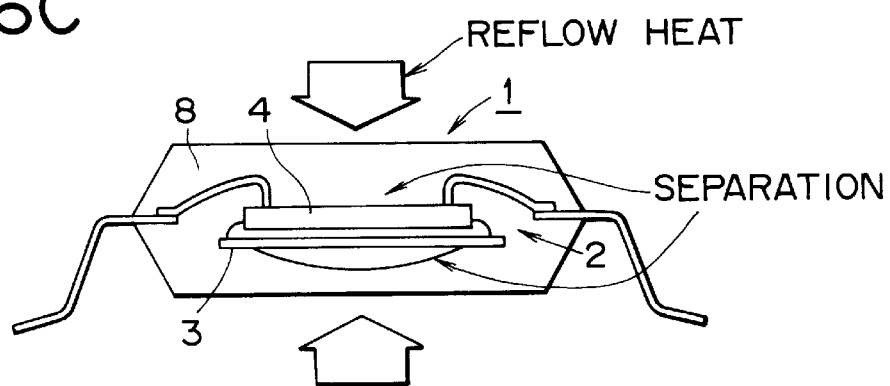
Figure 6D:
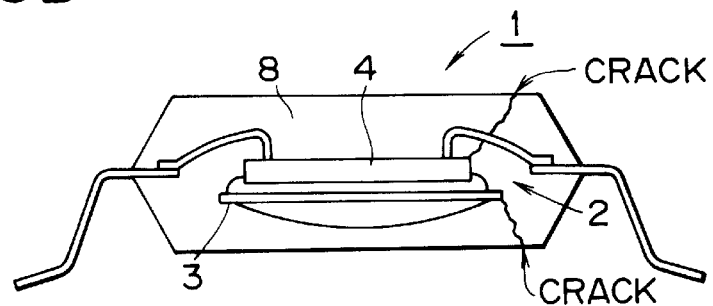
Figure 7:
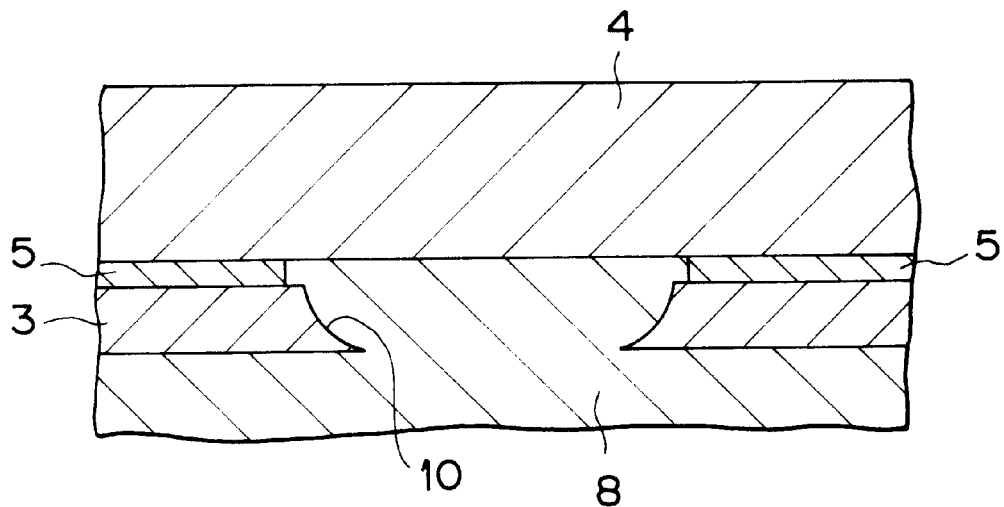
FIG. 7 is a partial cross sectional side view for describing the slit configuration of a conventional lead frame for semiconductor devices.
Figure 8:
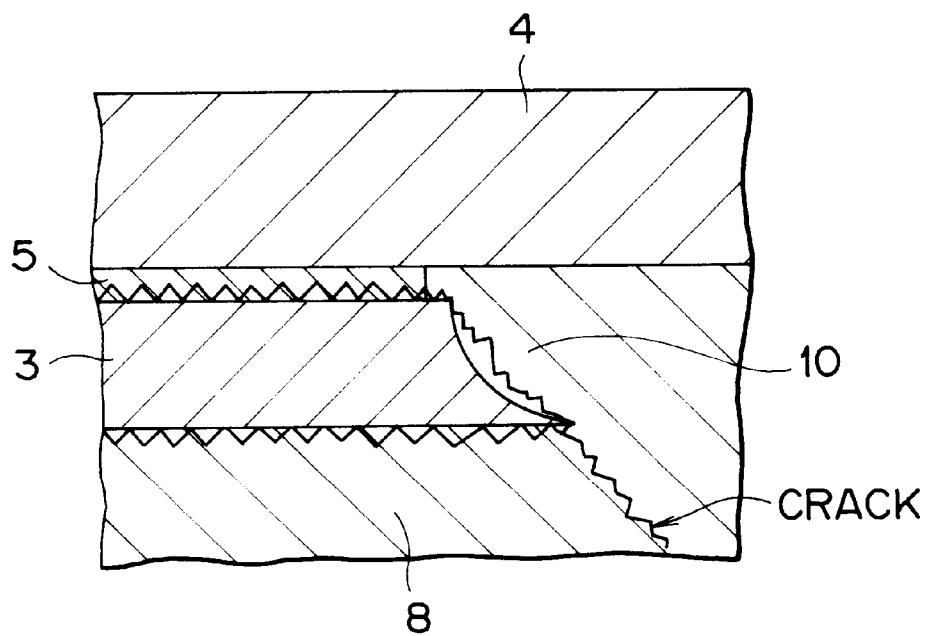
FIG. 8 is a partial cross sectional side view for describing the problem due to the slit configuration shown in FIG. 7.

A lead frame for resin sealed semiconductor devices of the present invention will be described in detail hereinafter with reference to the drawings. FIG. 1A to FIG. 1D are diagrams for describing one embodiment of a lead frame for semiconductor devices of the present invention. In these drawings, character 11 denotes a lead frame for semiconductor devices, and 12 denotes a semiconductor element die pad. The lead frame 11 of the present embodiment is different from the lead frame 2 shown in FIG. 4 and FIG. 7 in the configuration of a slit 13.

Figure 1A:
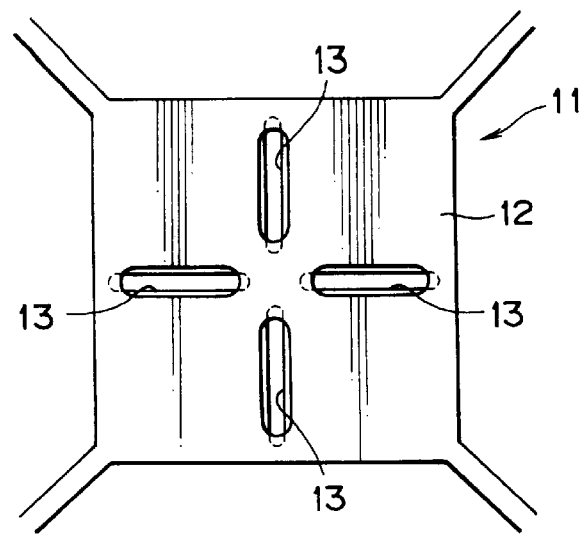
FIG. 1A is a plan view of a semiconductor element die pad.
Figure 1B:
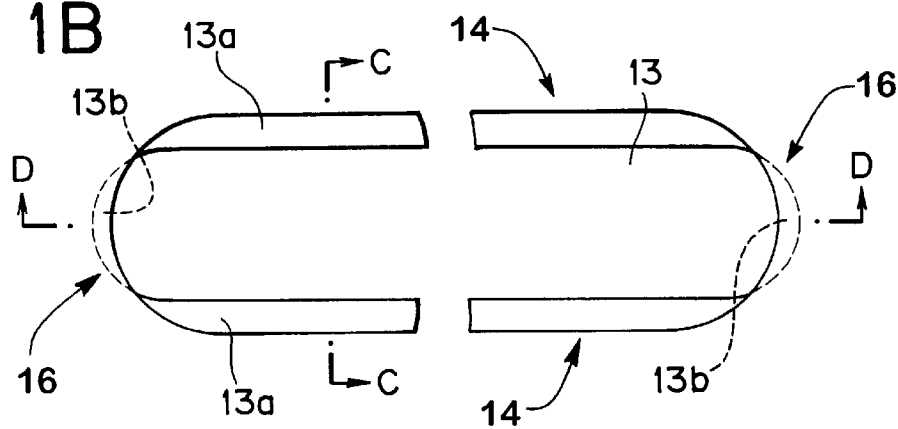
FIG. 1B is a partially enlarged plan view for illustrating the schematic structure of a slit.
Figure 1C:
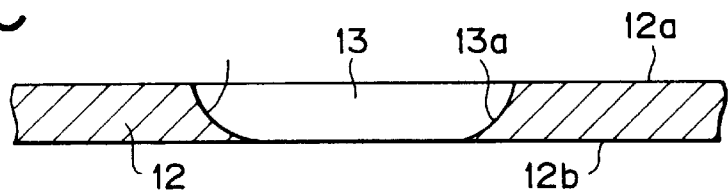
FIG. 1C is a cross sectional view along the line C—C in the arrow direction shown in FIG. 1B.
Figure 1D:
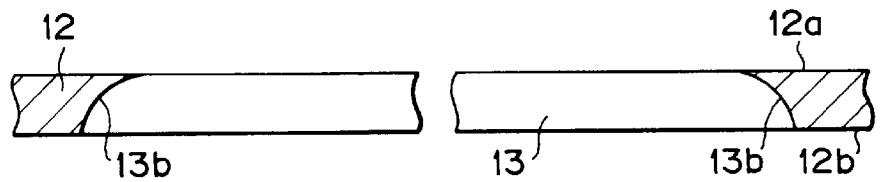
FIG. 1D is a cross sectional view along the line D—D in the arrow direction shown in FIG. 1B.

In detail, a slit 13 of a lead frame 11 of the present embodiment is the same as that of conventional lead frame 2 on the central portions 14 excepting the end portions 16, that is, the side wall surfaces 13a of the central portions 14 are formed so as to be inclined gradually to the inside increasingly from the semiconductor element supporting side 12a toward the back side 12b as shown in FIG. 1B and FIG. 1C, on the other hand, on the end portions 16, as shown in FIG. 1B and FIG. 1D, the side wall surfaces 13b are formed so as to be inclined gradually to the outside increasingly from the semiconductor element die pad side 12a to the back side 12b.

Figure 2A:
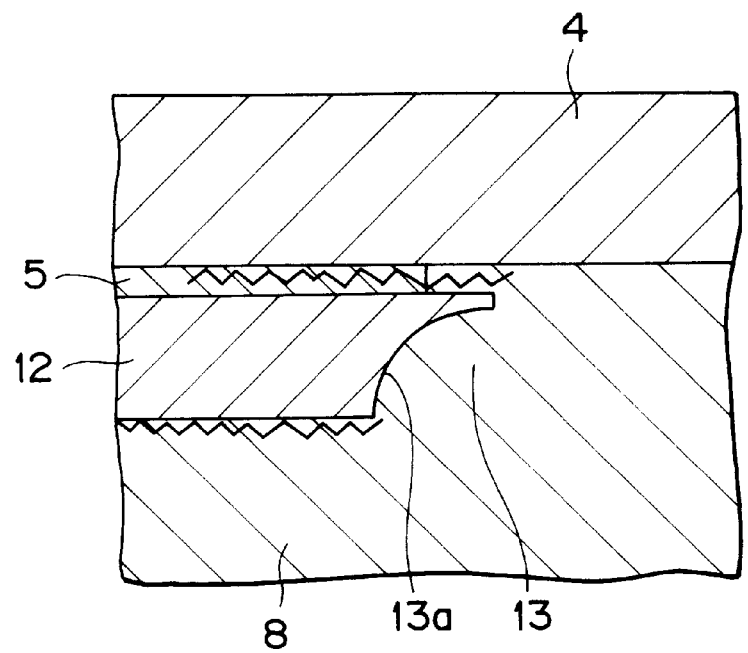
FIG. 2A and FIG. 2B are partially enlarged cross sectional views for describing the function of the lead frame for semiconductor devices shown in FIGS. 1A to 1D.
Figure 2B:
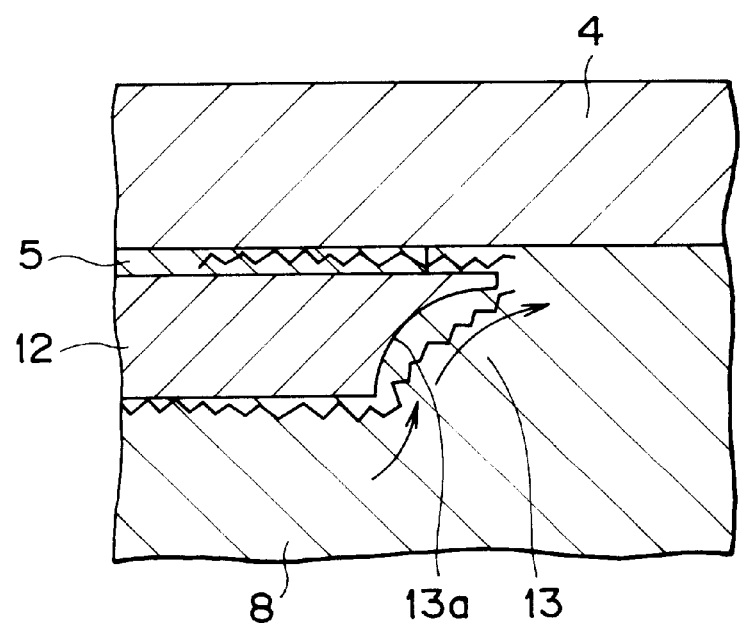
Figure 3:
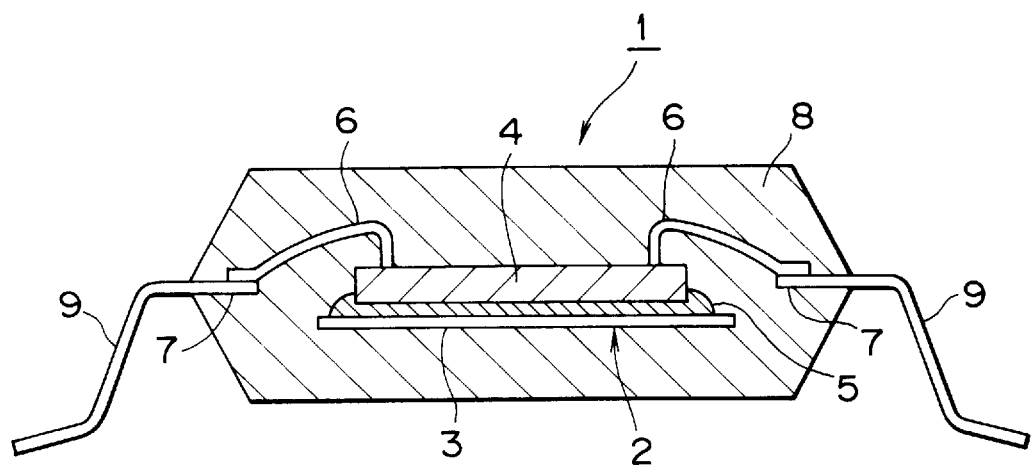
FIG. 3 is a cross sectional side view for describing one example of a resin sealed semiconductor device.

When a semiconductor device formed by use of the lead frame 11 having slits 13 as described herein above is conditioned under an ordinary temperature and humidity condition and then processed through mounting process, the separation of the interface between the semiconductor element 4 and semiconductor element die pad 12 and the interface between the semiconductor element die pad 12 and the sealing resin 8 occurs as in the case of a conventional lead frame as shown in FIG. 2A.

However, because the side wall surfaces 13b of the lead frame 11 on both end portions 16 are inclined in inverse relation to the side wall surfaces 13a on the central portions 14, the stress caused by separation on the interface between the semiconductor element 4 and the semiconductor element die pad 12 or the interface between the semiconductor element die pad 12 and the sealing resin 8 is exerted along the side wall surfaces 13b on both end portions 16 and guided to the interface between the back side of the semiconductor element 4 and the sealing resin 8 which are bonded together strongly each other, and thus cracking of the sealing resin 8 is prevented. Accordingly, the lead frame 11 of the present embodiment functions to prevent cracking of the sealing resin 8 of the semiconductor device which uses the lead frame of the present invention, and thus the function deterioration of the semiconductor device due to cracking is prevented.

Cross-shaped Slits 13 are formed so that the center of the cross is located at the center of the approximately square-shaped semiconductor element die pad 12 as shown in FIG. 1A, however, the location of the slits 13 is by no means limited to the case described herein above, and may be arbitrary.

As described hereinbefore, because the side wall surfaces of the slit of a semiconductor element die pad of a lead frame for semiconductor devices of the present invention are formed so as to be inclined gradually to the inside increasingly from the semiconductor element supporting side to the back side on the central portions, the inclination functions to anchor the sealing resin in the slit, and the bonding between the back side of the semiconductor element and sealing resin is strengthened.

On the other hand, because the side wall surfaces of the slit of the semiconductor element die pad are formed so as to be inclined gradually to the outside increasingly from the semiconductor element supporting side to the back side on the portions of both ends of the slit, the stress due to separation caused by the interface between the semiconductor element and the semiconductor element die pad or the interface between the semiconductor element die pad and sealing resin is guided along the side wall surfaces of both ends of the slit to the interface between the back side of the semiconductor element and sealing resin which are bonded together strongly, thus cracking of the sealing resin is prevented.

Because cracking of the sealing resin is prevented, failures such as defective and deteriorated function of semiconductor devices due to moisture absorption and subsequent heat treatment are prevented by using the lead frame for semiconductor devices of the present invention.

What is claimed is:

1. A lead frame for semiconductor devices, comprising:
   an element die pad having an element supporting side and an opposite back side, and
   at least one slit extending through said element die pad from the element supporting side to the back side and having a side wall surface having opposed central wall portions and opposed end wall portions, one of said opposed central wall portions and said opposed end wall portions being inclined toward an interior of said slit from the element supporting side to the back side, and another of said opposed central wall portions and said opposed end wall portions being inclined toward an exterior of said slit from the element supporting side to the back side.

2. A lead frame as claimed in claim 1, wherein said opposed central wall portions of the side wall surface of said slit are inclined toward the interior of said slit.

3. A lead frame as claimed in claim 1, wherein said opposed end wall portions of the side wall surface of said slit are inclined toward the exterior of said slit.

4. A lead frame as claimed in claim 1, wherein said opposed central wall portions of the side wall surface are inclined toward the interior of said slit from the element supporting side to the back side, and said opposed end wall portions of the side wall surface are inclined toward the exterior of said slit from the element supporting side to the back side.

5. A lead frame as claimed in claim 4, wherein the slit is an elongated slit and the opposed central wall portions are elongated.

6. A semiconductor device comprising a lead frame having a semiconductor element die pad which has a semiconductor element supporting side opposite a back side, a semiconductor supported by said lead frame, said lead frame having at least one slit extending through said semiconductor element die pad from the semiconductor element supporting side to the back side and having a side wall surface having opposed central portions and opposed end wall portions, wherein one of said opposed central wall portions and said opposed end wall portions is inclined toward an interior of said slit from the semiconductor element supporting side to the back side, and another of said opposed central wall portions and said opposed end wall portions being inclined toward an exterior of said slit from the element supporting side to the back side.

7. A semiconductor device as claimed in claim 6, wherein said opposed central wall portions of the side wall surface of said slit are inclined toward the interior of said slit.

8. A semiconductor device as claimed in claim 6, wherein said opposed end wall portions of the side wall surface of said slit are inclined toward the exterior of said slit.

9. A semiconductor device as claimed in claim 6, wherein said opposed central wall portions of the side wall surface are inclined toward the interior of said slit from the element supporting side to the back side, and said opposed end wall portions of the side wall surface are inclined toward the exterior of said slit from the element supporting side.

10. A semiconductor device as claimed in claim 9, wherein the slit is an elongated slit and the opposed central wall portions are elongated.

11. A semiconductor device as claimed in claim 6, wherein said semiconductor device is sealed with resin.

12. A lead frame as claimed in claim 1, wherein the opposed central wall and end wall portions of the side wall surface are inclined in inverse directions.

13. A lead frame as claimed in claim 1, wherein the element die pad has a planer shape.

14. A lead frame as claimed in claim 6, wherein the opposed central wall and end wall portions of the side wall surface are inclined in inverse directions.

15. A lead frame as claimed in claim 6, wherein the element die pad has a planer shape.

16. A semiconductor device lead frame comprising:
    an element die pad having opposed first and second sides, and
    a plurality of holes extending through the element die pad, each one of said holes having opposed first inclined side wall portions and opposed second inclined side wall portions, the first and second side wall portions extending from the first side of the element die pad to the second side of the element die pad at different directions of inclination.

* * * * *